United States Patent
Koinuma et al.

(10) Patent No.: US 7,692,184 B2
(45) Date of Patent: Apr. 6, 2010

(54) SUBSTRATE WITH ORGANIC THIN FILM, AND TRANSISTOR USING SAME

(75) Inventors: Hideomi Koinuma, Tokyo (JP); Kenji Itaka, Kanagawa (JP); Mitsugu Yamashiro, Kanagawa (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 0 days.

(21) Appl. No.: 10/594,152

(22) PCT Filed: Mar. 24, 2005

(86) PCT No.: PCT/JP2005/006199

§ 371 (c)(1),
(2), (4) Date: Sep. 25, 2006

(87) PCT Pub. No.: WO2005/091377

PCT Pub. Date: Sep. 29, 2005

(65) Prior Publication Data

US 2007/0190330 A1    Aug. 16, 2007

(30) Foreign Application Priority Data

Mar. 24, 2004   (JP) .............................. 2004-088077

(51) Int. Cl.
*H01L 35/24* (2006.01)
*H01L 51/00* (2006.01)
(52) U.S. Cl. ........... 257/40; 257/E51.001; 257/E51.049
(58) Field of Classification Search ............ 257/40
See application file for complete search history.

(56) References Cited

U.S. PATENT DOCUMENTS 5,500,537 A * 3/1996 Tsumura et al. ............... 257/40

(Continued)

FOREIGN PATENT DOCUMENTS

JP    9-232589 A    9/1997

(Continued)

OTHER PUBLICATIONS

Haemori et al, "Fabrication of Highly Oriented Rubrene Thin Films by the Use of Atomically Finished Substrate and Pentacene Buffer Layer," Japanese Journal of Applied Physics, vol. 44, No. 6A, 2005, pp. 3740-3742.*

(Continued)

*Primary Examiner*—Eugene Lee
*Assistant Examiner*—Anthony Ho
(74) *Attorney, Agent, or Firm*—Westerman, Hattori, Daniels & Adrian, LLP

(57) ABSTRACT

A substrate having organic thin film capable of growing two dimensionally such organic thin film as $C_{60}$ and a transistor using the same are constituted with a substrate (1) having organic thin film by sequentially depositing a buffer layer (3) and organic thin film (4) on the substrate (2), and with the buffer layer orienting the organic thin film (4). A layer easily oriented with the substrate (2) and the buffer layer (3) may be inserted between the substrate (2) and the buffer layer (3). A sapphire substrate as the substrate (2), pentacene or pentacene fluoride as the buffer layer (3), and $C_{60}$ or rubrene as the organic thin film (4) may be used, thereby $C_{60}$ or rubrene two dimensional thin film of high quality can be obtained. By using such a substrate (1) having organic thin film, a field effect transistor of high quality can be realized.

12 Claims, 15 Drawing Sheets

U.S. PATENT DOCUMENTS

| | | | | |
|---|---|---|---|---|
| 6,326,640 | B1* | 12/2001 | Shi et al. | 257/40 |
| 6,433,359 | B1* | 8/2002 | Kelley et al. | 257/40 |
| 6,872,969 | B2* | 3/2005 | Redecker | 257/40 |
| 2003/0001154 | A1* | 1/2003 | Epstein et al. | 257/40 |
| 2003/0160235 | A1* | 8/2003 | Hirai | 257/40 |
| 2004/0161873 | A1* | 8/2004 | Dimitrakopoulos et al. | 438/99 |
| 2004/0183070 | A1* | 9/2004 | Afzali-Ardakani et al. | 257/40 |

FOREIGN PATENT DOCUMENTS

JP            2003-324202 A        11/2003

OTHER PUBLICATIONS

English Translation of the International Preliminary Report on Patentability (Form PCT/IPEA/409) mailed Jan. 18, 2007, in corresponding International Application No. PCT/JP2005/006199 with Form PCT/IB/338.

K. Ueno et al.; "Van der Walls epitaxy on hydrogen-terminated Si(I I I) surfaces and investigation of its growth mechanism by atomic force microscope", Journal of Crystal Growth, vol. 150, 1995, pp. 1180-1185. Cited in the specification.

Y. Y. Lin et al.; "Stacked Pentacene Layer Organic Thin-Film Transistors with Improved Characteristics", IEEE Electron Device Letters, vol. 18, No. 12, Dec. 1997, pp. 606-608. Cited in the specification.

Vikram C. Sundar et al.; "Elastomeric Transistor Stamps: Reversible Probing of Charge Transport in Organic Crystal"; Science, vol. 303, Mar. 12, 2004, pp. 1644-1646. Cited in the specification.

R. W. I. de Boer et al.; "Organic single-crystal field-effect transistors", Phys. Stat. Sol. (a), vol. 201, No. 6, 2004, pp. 1302-1331. Cited in the specification.

International Search Report of PCT/JP2005/006199, date of mailing Jul. 5, 2005.

* cited by examiner

SUBSTRATE WITH ORGANIC THIN FILM, AND TRANSISTOR USING SAME

TECHNICAL FIELD

The present invention relates to a substrate having thin film, a transistor using the same, and methods of manufacturing the same.

BACKGROUND ART

In recent years, progress in devices using organic semiconductors is remarkable, and the studies on a field effect transistor (hereinafter, to be simply called FET) with organic semiconductor thin film have been eagerly conducted. These FET are mostly p-type FET, and few examples have been reported on n-type FET. As a n-type organic semiconductor, fullerene ($C_{60}$) has been drawing attention. For devices having FET or super lattice structure, two dimensional thin film needs to be manufactured for sequentially forming thin films of different compositions and film thicknesses at atomic level. However, compared with conventional inorganic semiconductors such as silicon and compound semiconductors, their manufacturing level is quite low.

A vacuum deposition method is known as one of the methods of manufacturing these organic semiconductor thin film, and it is known that $C_{60}$ thin film can be formed two dimensionally on metal. Also, in order to manufacture a field effect transistor from fullerene system materials such as $C_{60}$, thin films of high quality need to be deposited not on metal but on Si or an insulating substrate. For example, Non-Patent Reference 1 reports forming of $C_{60}$ thin film on a silicon (Si) substrate terminated with hydrogen.

FIG. 16 is an AFM (atomic force microscope) image of $C_{60}$ thin film deposited on a Si substrate of Reference 1 (K. Ueno and two others, "Van der Waals Epitaxy on Hydrogen-Terminated Si(III) Surfaces and Investigation of its Growth Mechanism by Atomic Force Microscope", 1995, Crystal Growth, Vol. 150, pp. 1180-1185), and (A) is an AFM image, and (B) is a diagrammatical cross-sectional view of $C_{60}$ thin film. Here, the measurement region of the AFM image is 4 μm×4 μm. As is seen from the figure, two dimensional growth is not attained, but columnar crystals of about 10 nm (100 Å) thickness and 1-2 μm size are dotted about on a Si substrate to grow so-called three dimensionally.

The field effect mobility of organic FET using pentacene has a value of about 1 $cm^2 \cdot V^{-1} \cdot s^{-1}$. (See, for example, Reference 2: Y. —Y. Lin and three others, Stacked Oentacene Layer Organic Thin-Film Transistors with Improved Characteristics", 1997, IEEE Electr. Device Lett., Vol. 18, No. 12, pp. 606-608.) This value is larger than that of amorphous Si. In case of organic FET, like the FET of semiconductor, materials of high field effect mobility are desired for increasing electric current driving force.

Recently, References 3 and 4 listed below report that the field effect mobility of a single crystal rubrene along a and b axes has quite large value of 4.4 $cm^2 \cdot V^{-1} \cdot s^{-1}$ and 15.4 $cm^2 \cdot V^{-1} \cdot s^{-1}$, respectively.

Reference 3: V. C. Sundar and 7 others, "Elastometric Transistor Stamps: Reversible Probing of Charge Transport in Organic Crystals", 2004, Science, vol. 303, pp. 1644-1646

Reference 4: R. W. I. De Boer and three others, "Organic Single-Crystal Field-Effect Transistors", 2004, Phys. Stat. Sol. A, Vol. 201, No. 6, pp. 1302-1331

However, by depositing rubrene on the ordinarily used quartz, corning glass, or sapphire substrate by a molecular beam vapor deposition apparatus, nothing but only amorphous thin film is obtained. FIG. 17 is an image of an atomic force microscope of rubrene thin film of 5×5 $μm^2$ deposited on a conventional sapphire substrate, and the substrate temperatures are (A) room temperature and (B) 100° C. As is obvious from the figure, the obtained rubrene film was amorphous.

For a practical use of field effect transistors of fullerene system materials such as $C_{60}$, forming of flat two dimensional growth film not on metal but on Si or an insulating substrate is strongly demanded. However, in case to grow $C_{60}$ thin film on an insulating substrate, it tends to be columnar growth, and thin film of high quality has not so far been obtained.

Also, from conventional rubrene thin film, only amorphous film is obtained which shows almost no function of FET property or others. Further, since this amorphous thin film is quite reactive with oxygen, it becomes transparent when taken out to atmosphere from orange color in vacuum. Thus, thin film forming is difficult, and though quite high field effect mobility is reported for a single crystal, the thin film of high quality needed for practical use of FET has not been obtained.

DISCLOSURE OF THE INVENTION

The present inventors have thought upon the present invention by discovering as the result of various trials that such organic materials as $C_{60}$ and rubrene can be grown two dimensionally by inserting a buffer layer of such a material as pentacene between an organic material such as $C_{60}$ and rubrene and a sapphire substrate.

In view of the problems mentioned above, it is a first object of the present invention to provide a substrate having organic thin film which can be grown two dimensionally such as $C_{60}$ and rubrene.

The present invention has a second object to provide a transistor using a substrate having said organic thin film.

The present invention further has a third object to provide methods of manufacturing a substrate having said organic thin film and a transistor using the same.

In order to attain said first object, the substrate having organic thin film of the present invention is characterized in that a buffer layer and organic thin film are sequentially deposited on the substrate, and the buffer layer orients the organic thin film.

In the above-mentioned aspect, preferably a layer readily oriented with the buffer layer is inserted between the substrate and the buffer layer.

Said substrate is an insulating substrate, preferably a sapphire substrate, the buffer layer is acene system aromatics or its derivative, preferably pentacene or pentacene fluoride, and the organic thin film is either $C_n$ fullerene (where n is an integer of 60 or more), a $C_n$ fullerene derivative, or rubrene. Preferably, the surface of the sapphire substrate is flattening-treated, and buffer layers made of pentacene or pentacene fluoride are laminated by a molecular layer unit.

According to the above-mentioned aspect, since extremely flat thin film of a unimolecular layer unit can be formed by inserting a buffer layer made of a specific material between the insulating substrates which so far had difficulty of crystal growth of such organic thin film as $C_{60}$ and rubrene, organic thin film can be grown after growing these. Therefore, the strain between the substrate and the organic thin film such as $C_{60}$ and rubrene is relaxed, the organic thin film such as $C_{60}$ and rubrene can be grown two dimensionally, and its crystal particle diameter can be enlarged. Thereby, organic thin film of high crystalline quality can be obtained, and a substrate having organic thin film can be offered which has improved properties such as mobility of organic thin film.

In order to attain said second object, the transistor of the present invention is characterized in that it is a transistor having organic thin film formed on a substrate, and said organic thin film is deposited on the substrate via a buffer layer orienting the organic thin film.

In the above-mentioned aspect, preferably a layer readily oriented with the buffer layer is inserted between the substrate and the buffer layer. The substrate is preferably a sapphire substrate, the buffer layer is acene system aromatics or its derivative, and the organic thin film is either $C_n$ fullerene (where n is an integer of 60 or more), a $C_n$ fullerene derivative, or rubrene. Also preferably, the buffer layer is either pentacene or pentacene fluoride, and the organic thin film is either $C_{60}$ or rubrene.

According to the above-mentioned aspect, the strain between the substrate and the organic thin film such as $C_{60}$ and rubrene is relaxed by inserting a buffer layer made of a specific material, the organic thin film such as $C_{60}$ and others can be grown two dimensionally, and its crystal particle diameter can be enlarged. Thereby, organic thin film of high crystalline quality can be obtained. As a consequence, a transistor such as a field effect transistor of high quality can be offered by improving mobility of organic thin film.

In order to further attain said second object, the method of manufacturing a substrate having organic thin film of the present invention is characterized in that it includes a process of sequentially depositing a buffer layer and organic thin film on a substrate, and the buffer layer orients the organic thin film.

In the above-mentioned aspect, a layer readily oriented with the buffer layer may be inserted between the substrate and the buffer layer.

The substrate is preferably an insulating substrate, especially a sapphire substrate, the buffer layer is acene system aromatics or its derivative, preferably pentacene or pentacene fluoride, and the organic thin film is either $C_n$ fullerene (where n is an integer of 60 or more), a $C_n$ fullerene derivative, or rubrene. Also preferably, the surface of the sapphire substrate is flattening-treated, and buffer layers made of pentacene or pentacene fluoride are laminated by a molecular layer unit. According to the present invention, organic thin film of high crystalline quality can be formed on a substrate.

Also, the method of manufacturing a transistor of the present invention is characterized in that organic thin film is formed on a substrate, and said organic thin film is laminated on a substrate via a buffer layer orienting said organic thin film.

In the above-mentioned aspect, a layer readily oriented with the buffer layer may be inserted between the substrate and the buffer layer. Preferably, the substrate is an insulating substrate, preferably a sapphire substrate, the buffer layer is acene system aromatics or its derivative, preferably pentacene or pentacene fluoride, and the organic thin film is either $C_n$ fullerene (where n is an integer of 60 or more), a $C_n$ fullerene derivative, or rubrene. Preferably, the surface of the sapphire substrate is flattening-treated, and buffer layers made of pentacene or pentacene fluoride are laminated by a molecular layer unit.

According to the above-mentioned aspect, organic thin film of high crystalline quality is formed on a substrate, and thereby a transistor using said organic thin film can be manufactured.

According to the present invention, a substrate can be obtained which has the organic thin film of high crystalline quality via a buffer layer on the surface of an insulating substrate or others. Also, a transistor using said organic thin film and the method of manufacturing the same are offered.

BEST MODES FOR CARRYING OUT THE INVENTION

Hereinafter, forms of implementations of the present invention will be described in detail to help better understanding with reference to the accompanying drawings illustrating several embodiments. Here, the Examples illustrated in the accompanying drawings are in no way intended to specify or limit the present invention, but only to facilitate explanation and understanding of the present invention.

The present invention will be explained in detail below based on the forms of implementations illustrated in the figures. In each figure, identical marks and symbols are used for identical or corresponding parts.

The First Embodiment

The first embodiment of the substrate having organic thin film of the present invention will be explained first.

Figure 1:
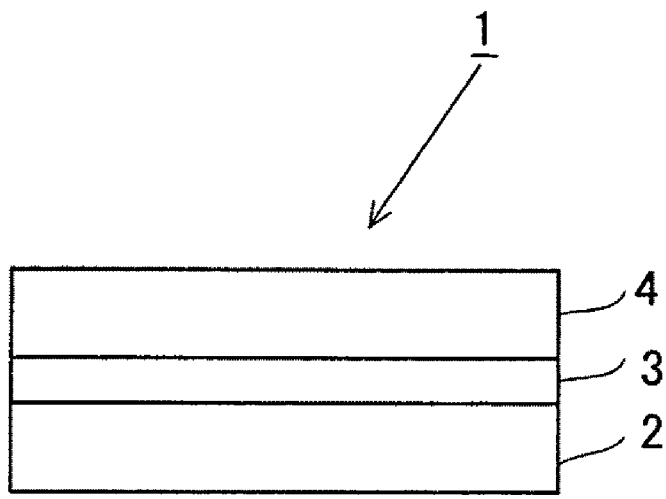
FIG. 1 is a cross-sectional view of a substrate having organic thin film in accordance with the first embodiment of the present invention.

FIG. 1 is a cross-sectional view of a substrate having organic thin film in accordance with the first embodiment of the present invention. As is shown in FIG. 1, the substrate 1 having organic thin film of the present invention has a structure of a buffer layer 3 made of a first organic material and an organic thin film 4 of $C_{60}$ or others as a second organic material sequentially deposited on a substrate 2.

Said buffer layer 3 has a function to orient the organic thin film 4. Therefore, the organic thin film 4 made of crystals can be grown on the substrate 1 in the organic materials from which only non-film-shaped columnar crystal or amorphous thin film have so far been obtained.

Here, the substrate 2 may be any substrate such as a sapphire substrate of hexagonal system, a glass substrate, and a quartz substrate, or any substrate that can readily orient organic materials such as polyimide. It is preferable to use the substrate 2 the surface of which is as flat as possible, and its surface roughness is preferably about same as the molecular layer of the material to be a buffer layer 3 or even lower. For example, in case that said buffer layer 3 is a pentacene thin film 3 mentioned below, the method of the present invention is applicable to a substrate of its surface roughness of about 15 Å. Also in case to form the laminated thin films of other metal or insulating materials needed for forming a device structure on the substrate 2, it may be enough that similar surface roughness is locally satisfied.

Also as a buffer layer 3, acene system organic materials such as pentacene and pentacene fluoride of triclinic system and their derivatives may be used.

Also as an organic thin film 4, either $C_n$ fullerene (where n is an integer of 60 or more), a $C_n$ fullerene derivative, or rubrene (5, 6, 11, 12-tetraphenylnaphthacene) may be used. As $C_n$ fullerene, $C_{70}$, $C_{120}$, and others may be used besides $C_{60}$ of hexagonal system.

Figure 2:
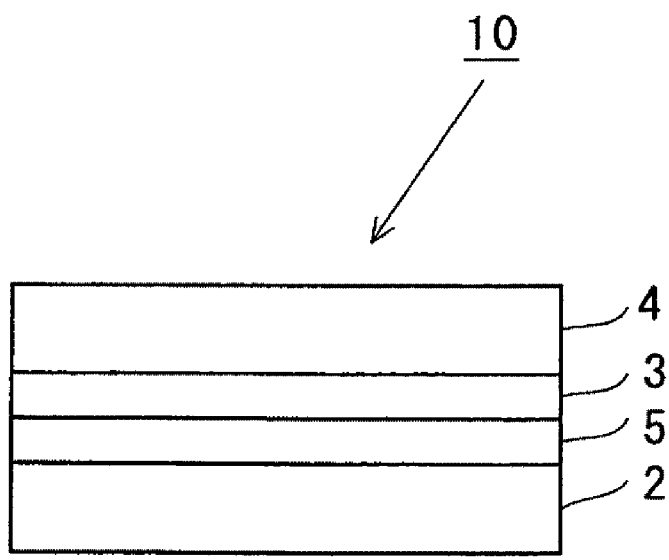
FIG. 2 is a cross-sectional view of a modified version of a substrate in accordance with the first embodiment of the present invention.

FIG. 2 is a cross-sectional view of a modified version of a substrate having organic thin film in accordance with the first embodiment of the present invention. As is shown in FIG. 2, the difference between the substrate 10 having organic thin film of the present invention and the substrate 1 having organic thin film of FIG. 1 is that a layer 5 readily oriented with the substrate 2 and/or the buffer layer 3 is additionally inserted between the substrate 2 and the buffer layer 3. As said layer 5 readily oriented with the substrate 2 and/or the buffer layer 3, an insulating layer may be used. Here, the insulating layer 5 may be $SiO_2$ or $Al_2O_3$ thin film deposited on the substrate 2.

Thus, as for the substrates 1 and 10 having organic thin film of the present invention, the orientation of the organic thin film 4 itself such as $C_{60}$ and rubrene can be improved, and the lattice strain of the organic thin film 4 and the substrate 2 can be relaxed by inserting the buffer layer 3 of about one to 10 molecular layer thickness. Here in the present invention, said buffer layer of about one to 10 molecular layer thickness is to be called the buffer layer 3 of a molecular layer unit.

Explanation is made here of the reason why organic thin film 4 can easily grow two dimensionally by insertion of the buffer layer 3. The case is studied in which a buffer layer 3 and $C_{60}$ thin film 4 are made of pentacene or pentacene fluoride thin film. In pentacene itself, π electrons protrude perpendicularly to a benzene ring, and their direction is important. π electrons of organic thin film, in general, have good affinity with metal in orientation, but tend to repulse insulators. However, after pentacene or pentacene fluoride thin film 3 is deposited on a substrate 2, π electrons of pentacene thin film are assumed as distorted. Therefore, if $C_{60}$ is deposited on pentacene thin film 3, it is presumed that the two dimensional growth of $C_{60}$ is easily attained. Thereby, the two dimensional growth of organic thin film such as $C_{60}$ is accelerated by insertion of a buffer layer 3, and hence substrates 1 and 10 having organic thin film 4 with remarkably improved flatness are obtained.

The Second Embodiment

The second embodiment of the transistor using the substrate having organic thin film of the present invention will be explained next.

Figure 3:
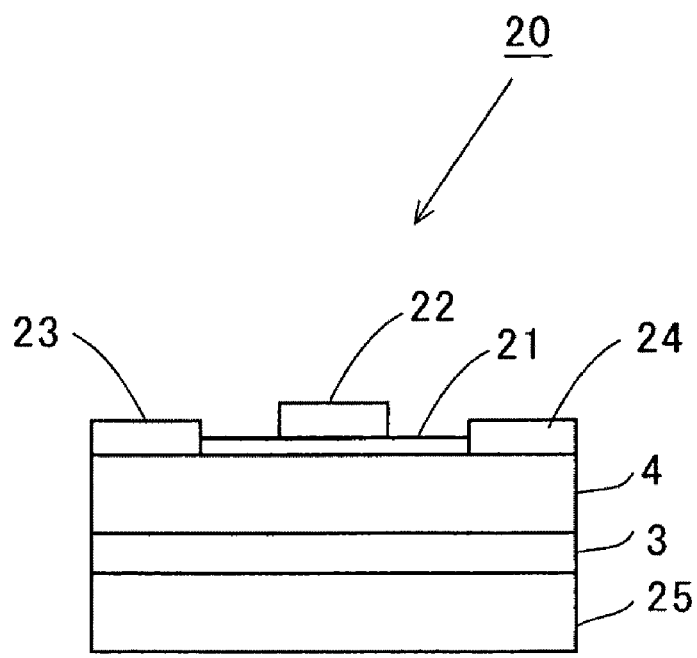
FIG. 3 is a view diagrammatically illustrating the structure of a transistor using the substrate having organic thin film in accordance with the second embodiment of the present invention.

FIG. 3 is a view diagrammatically illustrating the structure of a transistor using the substrate having organic thin film in accordance with the second embodiment of the present invention. As a transistor, the case of a field effect transistor is shown. As shown in the figure, a field effect transistor 20 has such a structure that a buffer layer 3 and organic thin film 4 are sequentially deposited on an insulating substrate 25, and a gate insulating film 21 is deposited on the organic thin film 4. A gate electrode 22 is provided in the gate insulating film 21, and a source electrode 23 and a drain electrode 24 on the organic thin film 4 as a channel, respectively. A protective film 26 may be deposited on the uppermost layer.

Here, a bonding region is formed with a gate electrode 22, a source electrode 23, and a drain electrode 24 in the region not shown in the figure.

As the material of the gate insulating film 21, aluminum oxide, hafnium oxide, silicon nitride, the oxides and sulfides of dielectric polymers or the like, and organics or the like may be used. Among these materials, especially the material of little leak current, high dielectric breakdown voltage, and high dielectric constant is preferred as electric field is easily applicable.

As the material of the gate electrode 22, aluminum (Al), gold (Au), or silicon (Si) with said materials added in may be used. Any appropriate one of said materials may be used depending upon the work function of organic thin film 4 and the acting method of FET. Also as the material of the source electrode 23 and the drain electrode 24, aluminum and gold may be listed. As these materials, those of high electric conductivity and good consistency of work function with organic thin film 4 are preferably selected, but may be selected depending upon the output as the object of FET. Further, as the material of the protective film 26, such insulators as alumina and silicon nitride may be listed.

Also, each layer of transistors 20 and 30 using a substrate having said organic thin film can be manufactured by vapor deposition method, molecular beam epitaxy method, various thin film deposition methods, such as high frequency sputtering method, photolithography method, or shadow mask.

As for the transistors 20 and 30 using a substrate having said organic thin film of the present invention, since the organic thin film 4 to be their channel is formed on the buffer layer 3, their crystalline quality is high. Therefore, the electric field mobility of organic thin film 4 is improved, and quite high mutual conductance ($g_m$) can be obtained. Thereby, transistors of high quality can be obtained by transistors 20 and 30 of the present invention.

The Third Embodiment

The third embodiment of the method of manufacturing the substrate having organic thin film of the present invention will be explained next.

The substrate 1 having organic thin film of the present invention can be manufactured by depositing a buffer layer 3 on a substrate 2 by the thin film depositing method which can control the thickness of the buffer layer 3 by molecular layer unit, followed by depositing the $C_{60}$ thin film 4 of hexagonal system or others on the buffer layer 3 by the pre-determined thickness. Here, an insulating film 5 such as $SiO_2$ being deposited in advance on the substrate 2, only the buffer layer 3 and the $C_{60}$ thin film 4 may be continuously deposited.

As said thin film depositing method, any method may be used for manufacturing so far as is a thin film depositing method which can control the thickness of at least the buffer layer on a substrate by molecular layer unit. Needless to say that the thickness of the $C_{60}$ thin film 4 as well as the buffer layer 3 may be controlled by molecular layer unit. As such a thin film depositing method, various vacuum vapor deposition method, molecular beam vapor deposition method as a kind of the vacuum vapor deposition methods, and laser ablation method may be listed.

An example is shown of a deposition apparatus usable for said deposition method.

Figure 5:
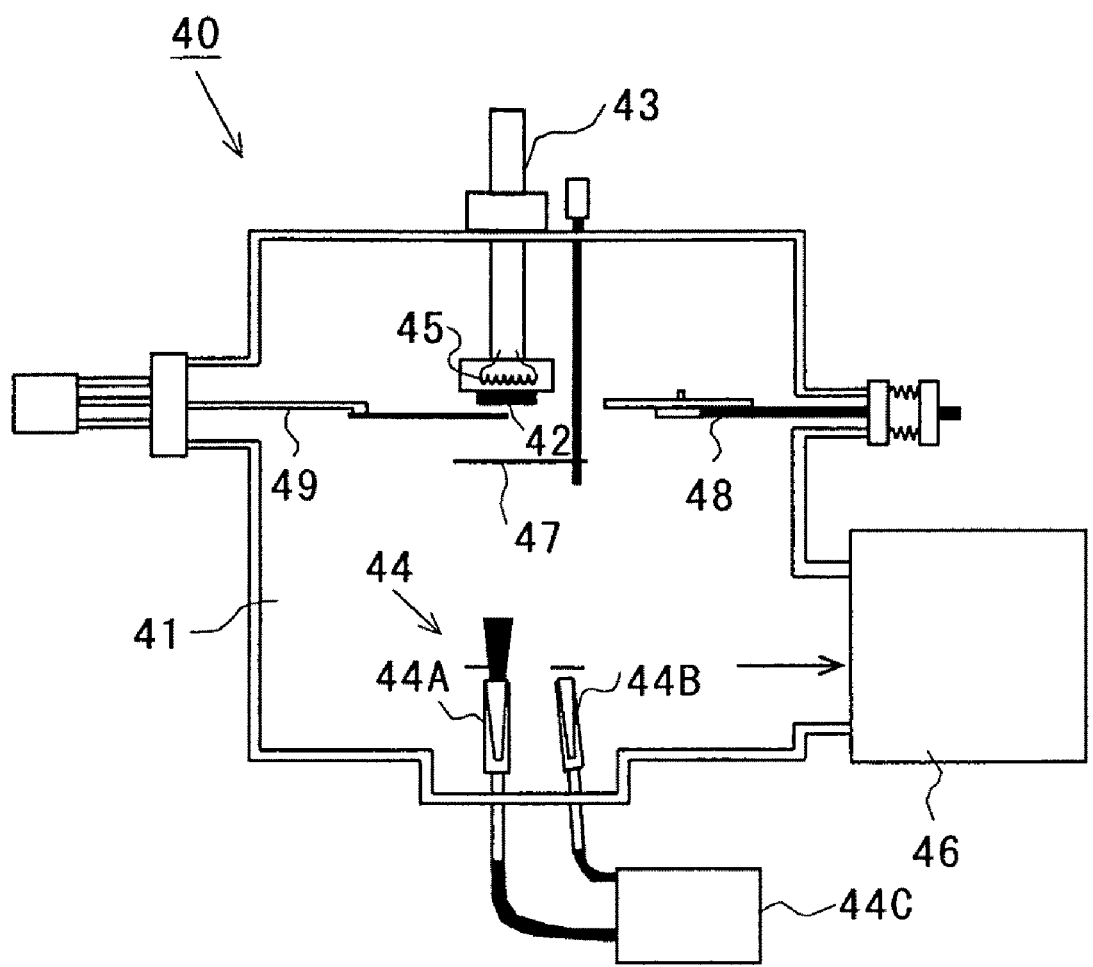
FIG. 5 is a view diagrammatically illustrating the structure of a molecular beam vapor deposition apparatus used for manufacturing a substrate having organic thin film of the present invention.

FIG. 5 is a view diagrammatically illustrating the structure of a molecular beam vapor deposition apparatus used for manufacturing a substrate having organic thin film of the present invention. The molecular beam vapor deposition apparatus 40 is provided with a holder 43 to hold a substrate 42 and a substrate heating means 45 such as a heater in a super high vacuum chamber 41, and further a molecular beam source crucible 44 (44A and 44B) as the vaporizing sources of the buffer layer 3 and organic thin film 4 and a power supply for heating the crucible 44C are provided under the super-high vacuum chamber 41.

The super high vacuum chamber 41 is evacuated by a vacuum exhaust equipment 46. The molecular beam source crucible 44 is a so-called Knudsen cell, vaporizing by heating individual vaporizing sources in the crucible 44. The output vapor is hit at the substrate 42 heated in the form of molecular beam, and the buffer layer 3 and organic thin film 4 are deposited on the substrate 42. In the upper part of the molecular beam source crucible 44 is provided a shutter 47 controlling radiation or non-radiation of molecular beam to the substrate 42.

Also a film thickness measuring means 48 is provided to measure the film thicknesses of the deposited buffer layer 3 and organic thin film 4. Said film thickness measuring means 48 may be provided with the resolution by decomposition layer unit for controlling the film thickness of the deposited layer by molecular layer unit, and hence a crystal transducer film thickness meter, a film thickness meter by light reflection, or the like may be used for it.

Further, in the super high vacuum chamber 41, a mask mechanism 49 may be provided to change the deposited film thickness on the substrate in the substrate plane. Said mask mechanism 49 is preferably a so-called combinatorial mask which can continuously change the in-plane thickness of the thin film to be deposited on the substrate 42.

In the above-mentioned embodiment, explanation is made of a substrate having organic thin film, a transistor using the same, and methods of manufacturing the substrate having organic thin film in accordance with the present invention.

A transistor can be fabricated by depositing by various depositing methods a gate insulating film or an electrode layer needed for the transistor structure on said substrate having organic thin film, and further by using a masking process and others. Also, an integrated circuit comprising a field effect transistor on the same substrate can be fabricated.

Example 1

As Example 1, a substrate 1 was manufactured which has organic thin film with the deposited buffer layer 3 and $C_{60}$ thin film 4 using pentacene thin film on a sapphire substrate 2 the surface of which is [1120] plane.

First, the sapphire substrate 2 was annealed in the atmosphere at 1000° C. for 3 hours and 750° C. for 3 hours to make the surface having a step-terrace structure flat by atomic level. Said sapphire substrate 2 was set in a molecular beam vapor deposition apparatus 40 (See FIG. 5.) of vacuum higher than $5 \times 10^{-8}$ Torr. Also as the vapor deposition sources of a crucibles 44A and 44B, pentacene and $C_{60}$ were used, respectively.

Next, the temperature of the sapphire substrate 2 was set at room temperature, the temperature of the crucible 44A was set at 200° C. to 300° C., the pentacene inside the crucible 44A was vaporized, thereby a buffer layer 3 comprising a monomolecular layer (about 15 Å) of pentacene was deposited on the sapphire substrate 2. The film-forming rate of pentacene thin film 4 of this case was 3 to 4 Å/min. Next, after setting the temperature of the sapphire substrate 2 at 150° C., the temperature of the crucible 44B was set at 300° C. to 400° C., $C_{60}$ inside the crucible 44B was vaporized, thereby $C_{60}$ thin film 4 of film thickness about 150 Å (about 20 molecular layers) was deposited on the buffer layer 3. The film-forming rate of $C_{60}$ thin film 4 of this case was 5 Å/min.

Figure 6:
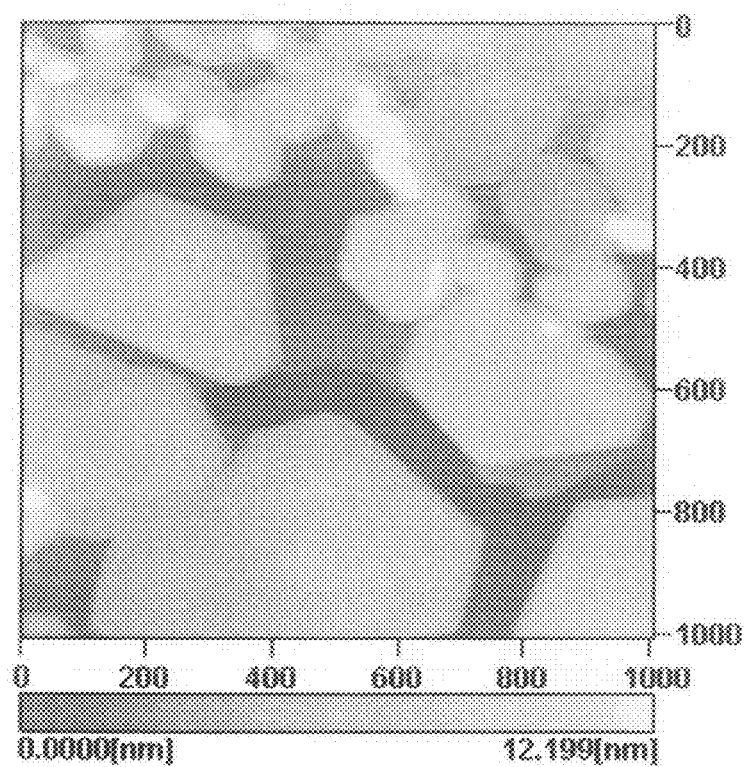
FIG. 6 is a photograph observed by an atomic force microscope of the $C_{60}$ surface of a substrate having organic thin film of Example 1.

The surface of said substrate 1 having organic thin film was observed by an atomic force microscope (AFM). FIG. 6 is a photograph observed by an atomic force microscope of the $C_{60}$ surface of a substrate 1 having organic thin film of Example 1. Here, the observation range was 1 μm×1 μm. As is obvious from the figure, a number of crystalline particle interfaces are observed in Comparative Example without a buffer layer 3 described below, whereas crystalline particle diameter increased remarkably in the $C_{60}$ thin film 4 of Example 1, and further a facet plane was observed, hence it was seen that the two dimensional growth was attained. The substrate 1 of Example 1 was high in flatness and crystallinity, and can be made such a device as a field effect transistor.

Explanation is made here of each lattice constant of said substrate 1 having organic thin film.

The sapphire substrate 2 is hexagonal, and its lattice constants are a=4.765 Å and c=13.001 Å. (See Reference 5: Catalogue of Shinkosha, 2002, http://www.shinkosha.com/products/rutile/nm04.html.) Also, the pentacene of the buffer layer 3 is triclinic, and the lattice constants of its thin film differ from bulk as a=6.11 Å, b=7.61 Å, and c=15.33 Å. (See Reference 6: J. S. Wu and another, "Electron diffraction of thin-film pentacene", 2004, J. Appl. Cryst., Vol. 37, p. 78.) Further, $C_{60}$ thin film 4 of Example 1 is hexagonal, and actual observation of its lattice constant revealed that a=10.08 Å and c=16.31 Å. The lattice constants of $C_{60}$ thin film are also reported as, for example, a=10.02 Å and c=16.36 Å. (See Reference 7: "Kagaku (Chemistry)", Kagaku Dojinsha, December 1991, Vol. 46, p. 857.)

Example 2

A substrate 1 was manufactured as in Example 1 except that the film thickness of $C_{60}$ thin film 4 was changed in plane by combinatorial mask. The thickness of the buffer layer 3 of pentacene thin film was monomolecular layer, and the film thickness of $C_{60}$ thin film 4 had thickness gradient distribution of about 0-500 Å in plane.

Figure 7A:
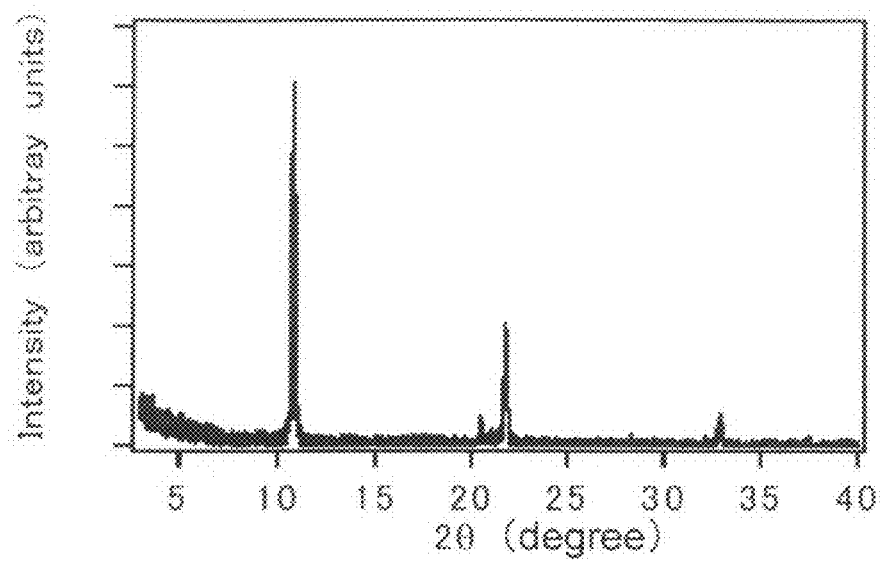
FIGS. 7 (A) and (B) are views showing the X-ray diffraction result and RHEED image, respectively, of the substrate having organic thin film of Example 2.
Figure 7B:
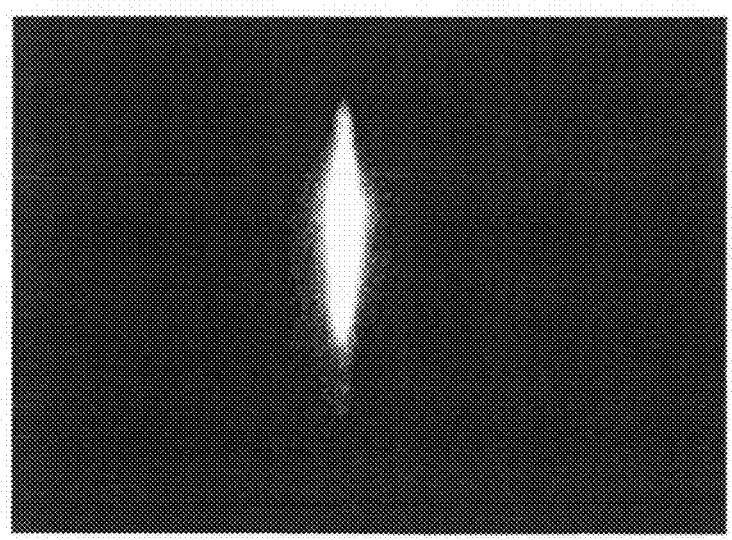

FIGS. 7 (A) and (B) are views showing the X-ray diffraction result and RHEED image, respectively, of the substrate 1 having organic thin film of Example 2. The abscissa of FIG. 7(A) is an angle 2θ (degree), and the ordinate is diffraction X-ray intensity (arbitrary unit). Here, the film thickness of $C_{60}$ thin film 4 is 500 Å. As is seen from the figure, diffraction strong in intensity was obtained from each diffraction plane (See FIG. 6, (002) plane and others.). Likewise, clear electron beak diffraction image (white linear part) was obtained from RHEED image shown in FIG. 7(B). It was recognized therefrom that the crystalline quality of $C_{60}$ thin film 4 is excellent.

As for organic thin film 4 obtained in Example 2, crystalline particle diameter and mobility of various organic thin films 4 having different film thicknesses were measured. As the result, it was recognized that mobility increases as the crystalline particle diameter of $C_{60}$ thin film 4 becomes larger.

Example 3

A field effect transistor 30 having $C_{60}$ thin film 4 as a channel was fabricated. (See FIG. 4.) On a flattened sapphire substrate 2 was vapor-deposited aluminum to be a gate electrode 22 by vacuum vapor deposition method by 200 to 400 Å, followed by deposition of aluminum oxide to be a gate insulating film 21 by RF magnetron sputtering method by about 2000 Å.

Next, by a method similar to Example 1, pentacene fluoride buffer layer 3 of about 1 to 3 molecular layer and $C_{60}$ thin film 4 of about 500 Å were sequentially deposited on a gate insulating film 21 consisting of aluminum oxide. For deposition, a molecular beam vapor deposition apparatus 40 having Knudsen cell was used. Next as a source electrode 23 and a drain electrode 24, magnesium (Mg) was deposited by pulse laser deposition method. In this case, device formation was conducted using a metal shadow mask. Finally, alumina thin film was deposited as a protective layer 26 on a device uppermost layer by about 5000 Å, thereby a n-type field effect transistor 30 of Example 3 was fabricated.

The electric field mobility of the channel of this n-type field effect transistor of Example 3 was 0.01 to 0.1 $cm^2 \cdot V^{-1} \cdot s^{-1}$.

Figure 8:
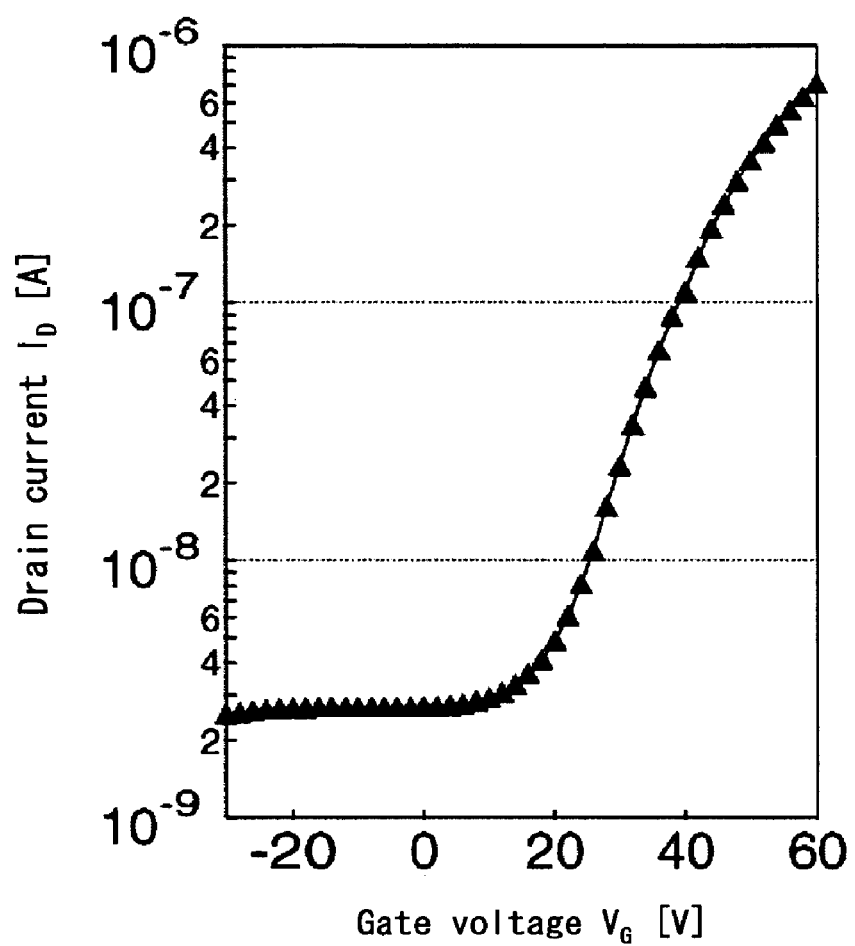
FIG. 8 is a graph showing the properties of gate voltage and drain current (Vg-Id) of a n-type field effect transistor of Example 3.

FIG. 8 is a graph showing the properties of gate voltage and drain current (Vg-Id) of a n-type field effect transistor of Example 3. In the figure, the abscissa is gate voltage (V), and the ordinate is drain current (A). Drain voltage is 60 V.

As is seen in the figure, when gate voltage Vg of about −20 V to 60 V was applied to the gate electrode 22, drain current Id was confirmed to change corresponding to the Vg change for Vg>20 V, and IV property of so-called enhancement type was obtained.

Comparative Example

As Comparative Example, a substrate was fabricated similarly to Example 1 in which a buffer layer 3 of Example 1 was not inserted, that is, a substrate having organic thin film with $C_{60}$ thin film 4 directly provided on a sapphire substrate 2. The thickness of $C_{60}$ thin film 4 was about 150 Å.

Figure 9:
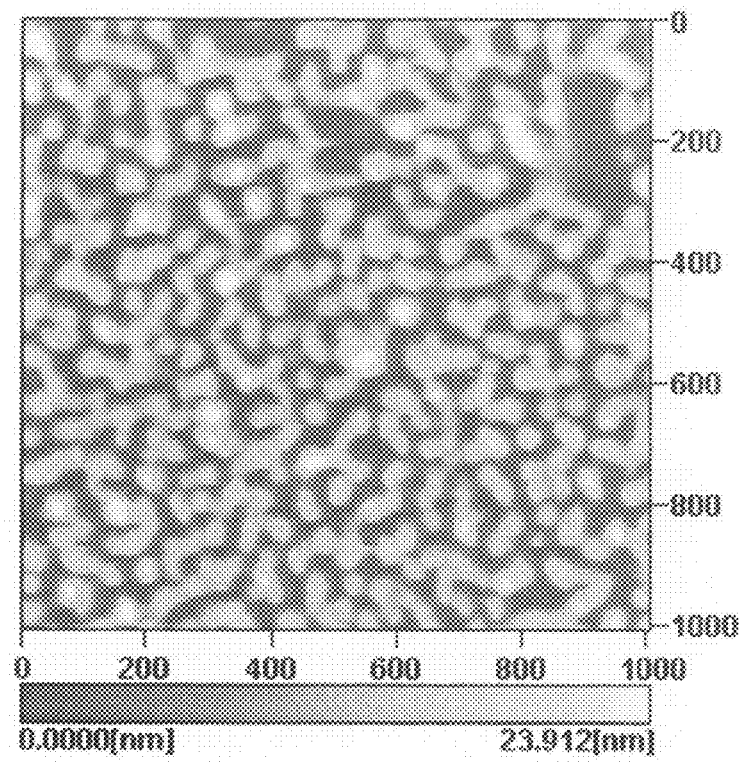
FIG. 9 is a photograph observed by an atomic force microscope of the $C_{60}$ surface of a substrate having organic thin film of Comparative Example.

FIG. 9 is a photograph observed by an atomic force microscope of the $C_{60}$ surface of Comparative Example. Here, the observation range is 1 μm×1 μm. As is seen from the figure, a number of crystalline particle interfaces are observed, and it is recognized as not two dimensional growth but the conventional three dimensional growth. In this Comparative Example, There were so deep crystalline particle interfaces that such device fabrication as a field effect transistor was difficult thereafter.

Figure 10A:
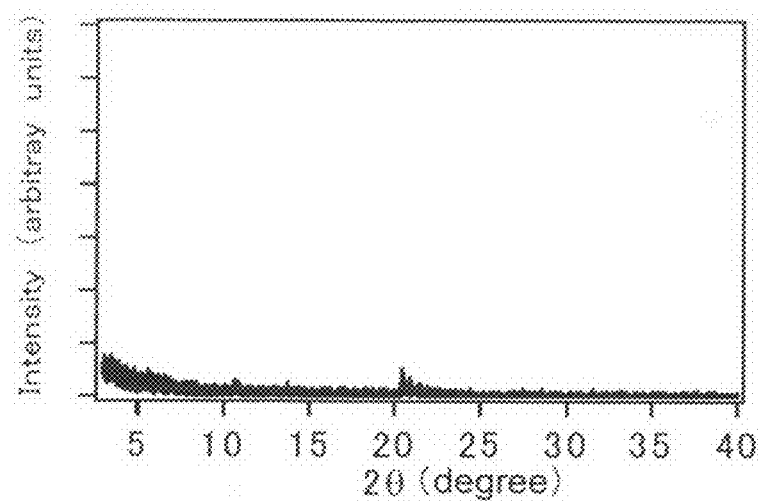
FIGS. 10 (A) and (B) are views showing the X-ray diffraction result and RHEED image, respectively, of the substrate having organic thin film of Comparative Example.
Figure 10B:

Also, FIGS. 10 (A) and (B) are views showing the X-ray diffraction result and RHEED image, respectively, of the substrate having organic thin film of Comparative Example. The abscissa of FIG. 10(A) is an angle 2θ (degree), and the ordinate is diffraction X-ray intensity (arbitrary unit). Here, The thickness of $C_{60}$ thin film is 500 Å. As is seen from the figure, almost no X-ray diffraction was obtained. Also in the RHEED image of FIG. 10(B), clear electron beam diffraction image was not obtained. The crystallinity of $C_{60}$ thin film of Comparative Example was recognized as poor therefrom.

Ultraviolet-visible light absorption spectra of $C_{60}$ thin film of Example 2 and Comparative Example were compared.

Figure 11:
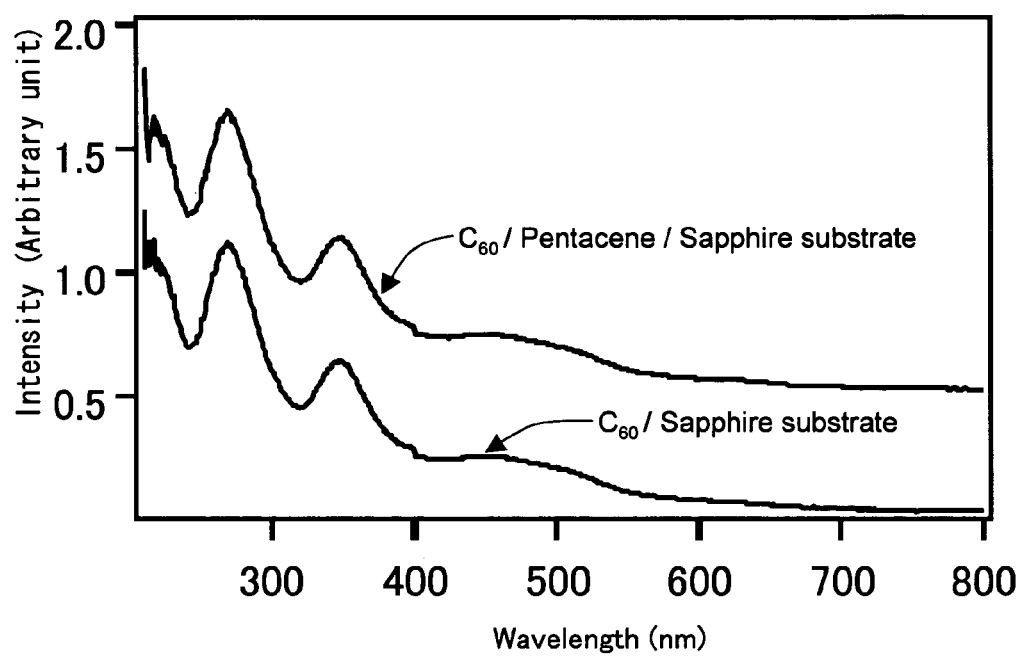
FIG. 11 is a graph showing a ultraviolet-visible light absorption spectra of $C_{60}$ thin film of Example 2 and Comparative Example.

FIG. 11 is a graph showing a ultraviolet-visible light absorption spectra of $C_{60}$ thin film of Example 2 and Comparative Example. The ordinate of the figure is absorption (arbitrary unit), and the abscissa is wavelength (nm). Here, The film thicknesses of $C_{60}$ thin film of both Example 2 and Comparative Example are 500 Å. As is seen from the figure, clear absorption strong in intensity occurred in Example 2 compared with Comparative Example. Especially, 220 nm absorption peak was observed in Example 2 while it was not observed in Comparative Example. The crystalline quality of $C_{60}$ thin film 4 of Example 2 was recognized therefrom as high.

Example 4

As Example 4, a substrate 1 was fabricated by the same method as Example 1 except that organic thin film was rubrene in which a buffer layer 3 using pentacene thin film and rubrene thin film 4 were deposited on a sapphire substrate 2 of [1120] plane. A sapphire substrate 2 treated on the surface having step-terrace structure flat by atomic level was set into a molecular beam vapor deposition apparatus 4 of 1×10⁻⁹ Torr vacuum. Also as the vapor deposition sources for crucibles 44A and 44B, pentacene and rubrene were used, respectively.

Next, a buffer layer 3 consisting of pentacene was deposited on a sapphire substrate 2 by vaporizing pentacene so that its film thickness had film thickness distribution of 0 to 1 molecular layer (about 15 Å) by combinatorial method. The film depositing rate of pentacene thin film 3 in this case was 3 to 4 Å/minute. The temperature of the sapphire substrate 2 was set next at room temperature or 100° C., the temperature of the crucible 44B was set at 300° C. to 400° C., rubrene inside the crucible 44B was vaporized, thereby rubrene thin film 4 was deposited on the buffer layer 3 to about 230 Å (about 9 molecular layers) as average film thickness. The film forming rate of rubrene thin film 4 in this case was 6 to 18 Å (0.6 to 1.8 nm)/minute.

Figures 12A, 12B:
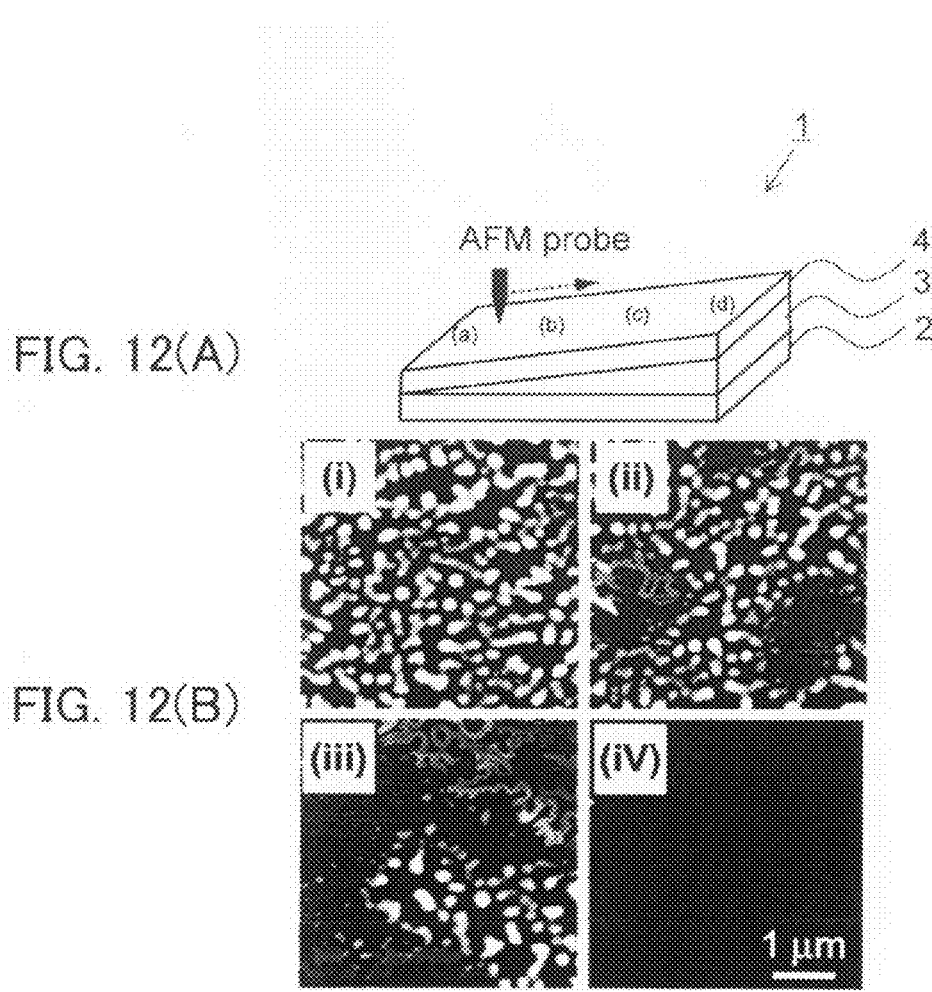
FIG. 12 (A) is a diagrammatical diagonal view of a substrate having organic thin film of Example 4, and (B) is a view showing an atomic force microscope image of rubrene thin film 4.

FIG. 12 (A) is a diagrammatical diagonal view of a substrate 1 having organic thin film of Example 4, and (B) is a view showing an atomic force microscope image of rubrene thin film 4. As is shown in FIG. 12 (A), the pentacene buffer layer 3 is thicker as it goes to the right side from left, and the thickness of the right-hand side (d) is monomolecular layer. The measurement by an atomic force microscope was conducted in the region (a)-(d) of FIG. 12(A), and the observation range was 5 μm×5 μm. Its results are shown in (i)-(iv) of FIG. 12 (B), respectively.

As is seen from FIG. 12 (B), it turns out that, as (i)-(iv) and the pentacene buffer layer 3 become thicker, the growth style of rubrene changes markedly. As is shown in FIG. 12 (B) (iv), as the substrate 2 was covered with the buffer layer 3 to the thickness of monomolecular layer, the crystalline particle diameter of rubrene thin film 4 increased markedly, a facet plane of markedly increased flatness was observed, and it is recognized that two dimensional growth was obtained.

Figures 13A, 13B, 13C:
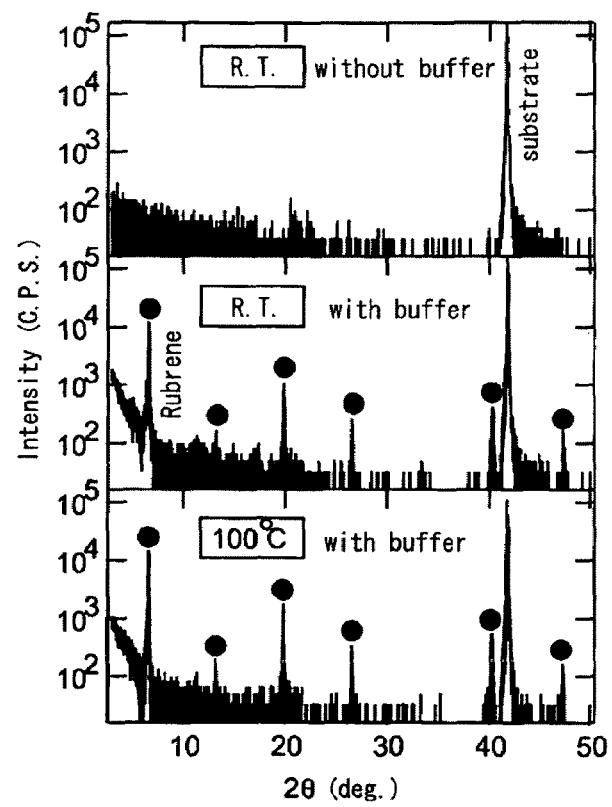
FIG. 13 is a view showing X-ray diffraction result of a substrate having organic thin film of Example 4, and (A) is the case without a buffer layer, and (B) and (C) are the cases where a buffer layer of monomolecular layer of pentacene is inserted where the substrate temperatures are room temperature and 100° C., respectively.

FIG. 13 is a view showing X-ray diffraction result of a substrate 1 having organic thin film of Example 4, and (A) is the case without a buffer layer, and (B) and (C) are the cases where a buffer layer 3 of monomolecular layer of pentacene is inserted where the substrate temperatures are room temperature and 100° C., respectively. The abscissa of the figure is an angle 2θ (degree), and the ordinate is diffraction X-ray intensity (arbitrary unit). Here, the film thickness of rubrene thin film 4 is 50 nm (500 Å).

As is seen in the figure, when a pentacene buffer layer 3 of monomolecular layer was inserted, diffraction strong in intensity was obtained from each diffraction plane (See solid dots (●) of FIG. 13). On the other hand, diffraction was not observed from rubrene without a buffer layer, but only diffraction from a substrate 2 was observed.

Figure 14A:
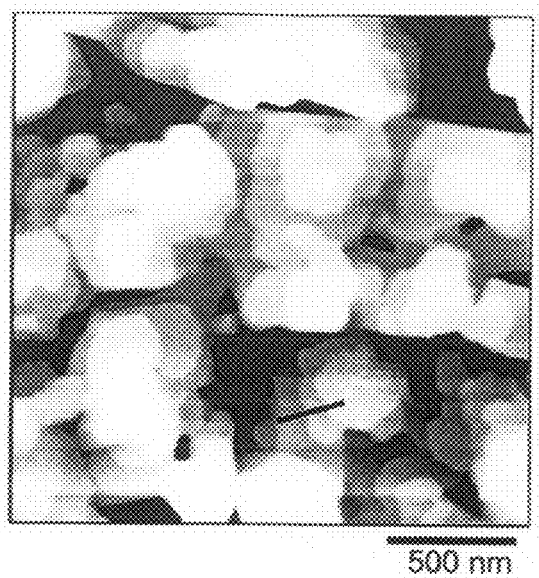
FIG. 14 (A) is a photograph showing atomic force microscope image of the surface, and (B) is a graph showing the height distribution of the surface in a rubrene thin film on a monomolecular pentacene buffer layer of Example 4.
Figure 14B:
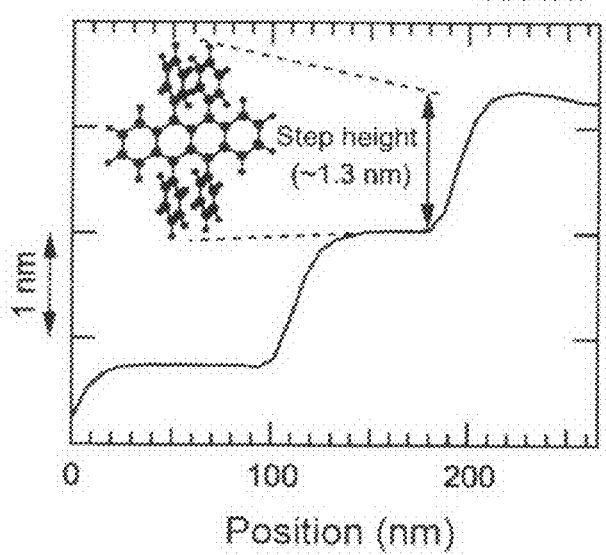

FIG. 14 (A) is a photograph showing atomic force microscope image of the surface, and (B) is a graph showing the height distribution of the surface in a rubrene thin film on a monomolecular pentacene buffer layer of Example 4. Here, the observation range is 2 μm×2 μm. In FIG. 14 (B), the ordinate is thickness (nm), and the abscissa is distance (nm).

As is seen from FIG. 14 (A), the crystalline particle diameter in rubrene thin film 4 of Example 4 increased markedly to 0.1 to 0.5 μm, and it is recognized that two dimensional growth was attained. It is also recognized that a step was about 1.3 nm from shape measurement of its cross section, and that rubrene thin film 4 was oriented in the c axis direction.

From above, the monomolecular layer pentacene buffer layer 3 could be formed on a sapphire substrate 2, and a crystalline rubrene thin film 4 could be formed on its surface. Further, said rubrene thin film 4 was high in flatness and crystallinity, and could be made a device such as a field effect transistor.

Example 5

Figure 4:
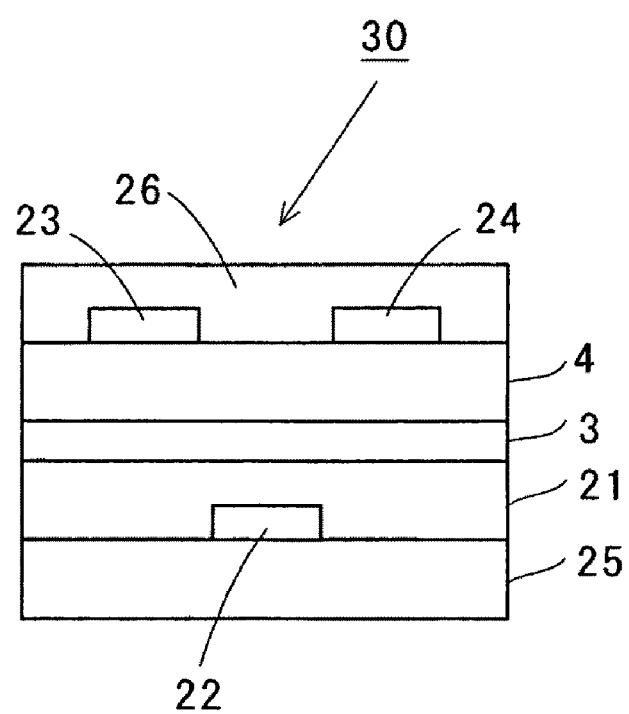
FIG. 4 is a cross-sectional view of a modified version of a transistor using the substrate having organic thin film in accordance with the second embodiment of the present invention.

As Example 5, a field effect transistor 30 having p-type rubrene thin film 4 as a channel was fabricated (See FIG. 4.). Said field effect transistor 30 was fabricated as in Example 3 except that a gate electrode 22 was Al of 30 nm thickness, a gate insulating film 21 was aluminum oxide of 300 nm, and further, as a source electrode 23 and a drain electrode 24, Ni of film thickness 10 nm and Au of 30 nm were sequentially deposited.

More concretely, after a gate electrode 22 and a gate insulating film 21 were formed on the sapphire substrate 22 surface-treated in the same manner as in Example 3, a pentacene buffer layer 3 of 2 nm was deposited, and rubrene thin film 4 of 50 nm film thickness was grown as a channel. A source electrode 23 and a drain electrode 24 were formed on its surface, and finally alumina thin film was deposited as a protective film 26 on the device uppermost layer, thereby a field effect transistor 30 of Example 5 was fabricated.

The electric field mobility of the channel of said field effect transistor 30 of Example 5 was 0.05 $cm^2 \cdot V^{-1} \cdot s^{-1}$.

Figure 15:
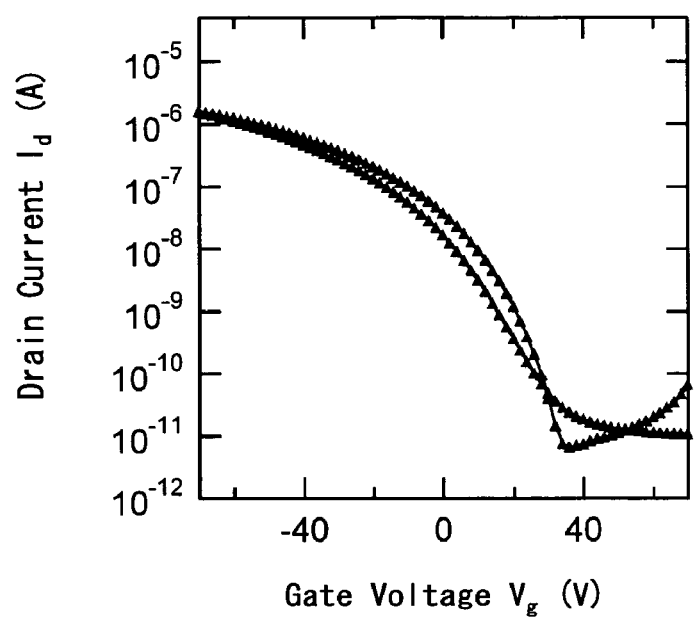
FIG. 15 is a graph showing the properties of gate voltage and drain current (Vg-Id) of a field effect transistor of Example 5.
Figure 16A:
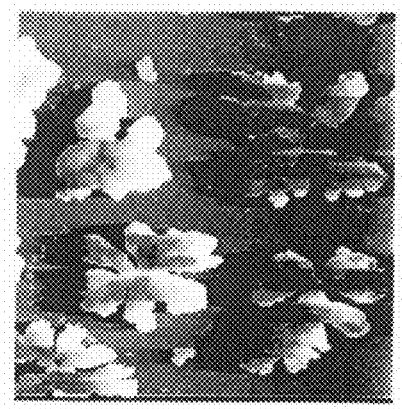
FIG. 16 is an AFM (atomic force microscope) photograph of a conventional $C_{60}$ thin film deposited on a Si substrate, and (A) is an AFM image, and (B) is a diagrammatical cross-sectional view of $C_{60}$ thin film.
Figure 16B:
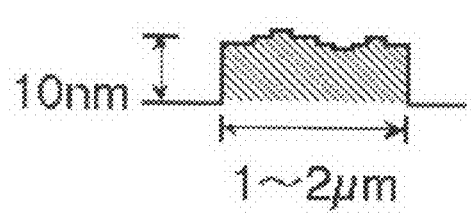
Figure 17A:
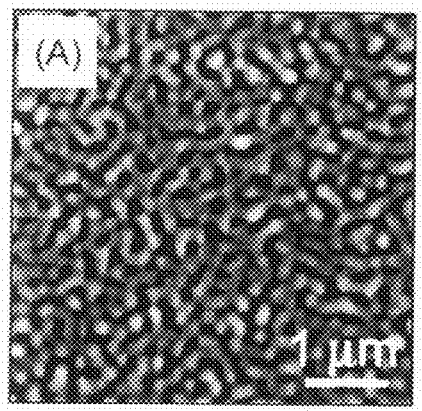
FIG. 17 is a view showing atomic force microscope image of rubrene thin film of 5×5 µm² deposited on a conventional sapphire substrate, and the substrate temperatures are (A) room temperature and (B) 100° C., respectively.
Figure 17B:
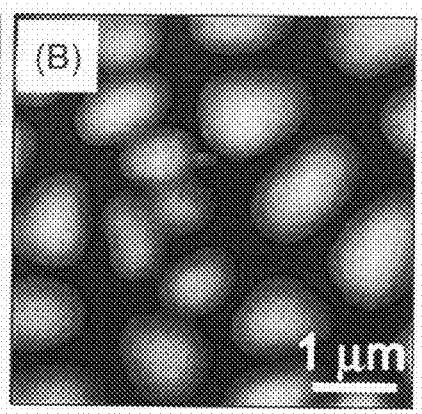

FIG. 15 is a graph showing the properties of gate voltage and drain current (Vg-Id) of a field effect transistor of Example 5. In the figure, the abscissa is gate voltage (V), and the ordinate is drain current (A). In the figure, drain voltage is 70 V.

As is seen in the figure, when gate voltage Vg of about −70 V to 70 V was applied to the gate electrode 22, the IV property was obtained that drain current Id increased corresponding to the Vg decrease for Vg<40 V.

The present invention is not limited to the above-mentioned examples, and needless to say that various modifications are possible within the range of the invention recited in claims, and they are also included in the present invention. For example, the transistors described in the above-mentioned embodiments are applicable to other transistors, not limited to a field effect transistor.

What is claimed is:

1. A substrate having an organic thin film, characterized in that: a buffer layer and the organic thin film are sequentially deposited on a substrate so that the organic thin film overlies the buffer layer,
wherein said substrate is an insulating substrate, said buffer layer consisting essentially of either pentacene or pentacene fluoride; said organic thin film is either $C_n$ fullerene, wherein n is an integer of 60 or more, or rubrene; and said organic thin film is a two dimensional film.

2. The substrate having an organic thin film as set forth in claim 1, characterized in that a layer easily oriented with said buffer layer is further inserted between said substrate and said buffer layer.

3. The substrate having an organic thin film as set forth in claim 1, characterized in that said insulating substrate is a sapphire substrate and said $C_n$ fullerene is $C_{60}$.

4. The substrate having an organic thin film as set forth in claim 3, characterized in that the surface of said sapphire substrate is flattening-treated, and said buffer layer consists of either pentacene or pentacene fluoride deposited as a molecular layer unit.

5. A transistor provided with an organic thin film formed on a substrate, characterized in that: said organic thin film is deposited on said substrate via a buffer layer, and orienting said organic thin film flatly;
wherein said substrate is an insulating substrate, said buffer layer consisting essentially of either pentacene or pentacene fluoride; wherein the organic thin film overlies the buffer layer; said organic thin film is either $C_n$ fullerene, wherein n is an integer of 60 or more, or rubrene; and said organic thin film is a two dimensional film.

6. The transistor as set forth in claim 5, characterized in that a layer easily oriented with said buffer layer is further inserted between said substrate and said buffer layer.

7. The transistor as set forth in claim 5, characterized in that said insulating substrate is a sapphire substrate, and said $C_n$ fullerene is $C_{60}$.

8. The transistor as set forth in claim 7, characterized in that the surface of said sapphire substrate is flattening-treated, and said buffer layer consists of either pentacene or pentacene fluoride deposited as a molecular layer unit.

9. A substrate having an organic thin film, characterized in that: a buffer layer and an organic thin film are sequentially deposited on the substrate so that the organic thin film overlies the buffer layer, said buffer layer consists essentially of either pentacene or pentacene fluoride, said buffer layer orients said organic thin film flatly, and said organic thin film is a two dimensional film.

10. A substrate having an organic thin film, characterized in that: a buffer layer and the organic thin film are sequentially deposited on a substrate so that the organic thin film overlies the buffer layer; said buffer layer consists essentially of either pentacene or pentacene fluoride, said organic thin film is either $C_n$ fullerene, wherein n is an integer of 60 or more, or rubrene, said buffer layer orients said organic thin film flatly, and said organic thin film is a two dimensional film.

11. A transistor, characterized in that: it is a transistor having an organic thin film formed on a substrate, said organic thin film is deposited on said substrate via a buffer layer consisting essentially of either pentacene or pentacene fluoride, said buffer layer orienting the organic thin film flatly, wherein the organic thin film overlies the buffer layer, and said organic thin film is a two dimensional film.

12. A transistor, characterized in that: it is a transistor having an organic thin film formed on substrate, said organic thin film is deposited on said substrate via a buffer layer consisting essentially of either pentacene or pentacene fluoride, said buffer layer orienting the organic thin film flatly, and said organic thin film is either $C_n$ fullerene, wherein n is an integer of 60 or more, or rubrene, wherein the organic thin film overlies the buffer layer, and said organic thin film is a two dimensional film.

* * * * *